United States Patent [19]
Chang

[11] Patent Number: 5,172,209
[45] Date of Patent: Dec. 15, 1992

[54] INTEGRAL BI-CMOS LOGIC CIRCUIT
[75] Inventor: Deugsoo Chang, Seoul, Rep. of Korea
[73] Assignee: Samsung Electronics Co., Ltd., Kyunggi, Rep. of Korea
[21] Appl. No.: 698,543
[22] Filed: May 10, 1991
[30] Foreign Application Priority Data
 Oct. 29, 1990 [KR] Rep. of Korea ............... 90-17382
[51] Int. Cl.$^5$ .............................. H01L 27/02
[52] U.S. Cl. ................ 257/368; 257/378; 257/567; 257/577
[58] Field of Search ............... 357/43, 46, 42, 23.3, 357/41

*Primary Examiner*—Mark V. Prenty
*Attorney, Agent, or Firm*—Christie, Parker & Hale

[57] ABSTRACT

An integral Bi-CMOS logic circuit includes a pair of first transistors and a pair of second transistors. The pair of the first transistors includes a P-type MOS transistor receiving an input signal through its gate, and an NPN-type bipolar transistor with its base connected to the drain of the P-type MOS transistor outputting a first output signal. The pair of the second transistors includes an N-type MOS transistor receiving the input signal through its gate, and a PNP bipolar transistor with its base connected to the drain of the N-type MOS transistor outputting the first output signal. A final output signal is outputted through a common emitter of the bipolar transistors.

16 Claims, 4 Drawing Sheets

INTEGRAL BI-CMOS LOGIC CIRCUIT

BACKGROUND OF THE INVENTION

1. Field of the Invention

The present invention relates to a Bi-CMOS logic circuit, and particularly to an integral Bi-CMOS logic circuit in which the drains of an N-type MOS transistor and a P-type MOS transistor are formed as a dual layer diffusing structure to serve as the bases of PNP and NPN bipolar transistors, thereby integrally constructing the functional section and the driving section.

2. Description of the Art

Attempts to form different semiconductor devices such as bipolar transistors and CMOS transistors on the same semiconductor substrate have been made for a long time, and a Bi-CMOS semiconductor device has advantages due to a complementing effect such as the high speed and high power driving ability of the bipolar transistor, and the high density and the low power consumption of the CMOS transistor.

FIG. 1 is a circuit diagram of a Bi-CMOS transistor. In this drawing, the Bi-CMOS logic circuit is an inverter circuit for inverting signals supplied through its input terminal before outputting through its output terminal.

The Bi-CMOS logic circuit of FIG. 1 includes: a pair of first transistors, i.e. a P-type MOS transistor MP11 and an N type MOS transistor MN11, with their sources connected respectively to a power voltage Vcc and ground GND, with their gates receiving input signals IN, and with their common drain outputting first output signals OUT11;

a pair of second transistors, i.e. N-type MOS transistors MN13, MN12, with their gate terminals and the base of a bipolar transistor BN11 respectively receiving the input signals IN and first output signals OUT11 of the pair of the first transistors MP11, MN11 respectively, with the drain of one terminal and the source terminal connected respectively to an output terminal OUT and ground, and with the common source terminal and the drain terminal outputting second output signals OUT12; and a pair of third transistors, i.e. NPN-type bipolar transistors BN11, BN12, with their bases receiving the first output signals OUT11 and the second output signals OUT12 of the second transistors including the N-type MOS transistors MN11, MN12, with their collectors connected respectively to the power voltage Vcc and ground, and with their common emitter outputting the final output signals OUT.

In the Bi-CMOS inverter circuit described above, if a high signal is supplied to input terminal IN, the N-type MOS transistor of the pair of the first transistors turns on, and the first output signal OUT11 shifts to a low state. At the same time, the N-type MOS transistor MN13 of the pair of the second transistors turns off, and the MOS transistor MN12 turns on, so that the output terminal OUT is pulled low.

If a low signal is supplied to the input terminal IN, the P-type MOS transistor MP11 of the pair of the first transistors turns on, and the first output signal OUT becomes high. When the N-type MOS transistor MN13 of the second transistors turns on, the second output signal OUT12 becomes low. Therefore, the NPN type bipolar transistor BN11 turns on, so that the final output signal OUT is high.

Bi-CMOS logic circuits have been applied to digital logic devices having a high power driving ability, and also applied to the static RAM (SRAM) and to gate array devices.

The Bi-CMOS logic circuit described above consists of four MOS transistors and two NPN-type bipolar transistors, with the MOS transistors serving as a functional section, while the bipolar transistors serve as a driving section. Thus, the Bi-CMOS logic circuit above described performs a two-step operation, i.e. inverting the input signals IN and transferring them to the output terminal OUT.

FIG. 2 is a vertical sectional view of the integrated circuit in which the Bi-CMOS logic circuit of FIG. 1 is formed on an epitaxial layer. That is, an NPN-type bipolar transistor is provided with a buried layer in such a form that: an n− epitaxial layer 22 which functions as a collector region is formed on buried layer 21, and a P base region 24 and an n+ emitter region 23 are formed on the n− epitaxial layer 22.

An N-type MOS transistor is formed with n+ source and drain regions 26, 27 on a P− epitaxial layer 25. A P-type MOS transistor is formed with an n− epitaxial layer 29 on an n+ buried layer 28, and P+ source and drain regions 30, 31 are formed on an n− epitaxial layer 29. Here, the n+ regions 32, 34 and the P+ region 33 are the regions for separating the devices.

Referring to the vertical sectional view of FIG. 2, an exemplary Bi-CMOS logic circuit comprises a functional section consisting of MOS transistors and a driving section consisting of bipolar transistors as described above. Further, they are formed by simply connecting N type and P type MOS transistors and NPN type bipolar transistors which are independent of one another.

Therefore, there are disadvantages in the above-described structure. First, in terms of the chip, an area as great as the area of the driving section including the bipolar transistors is required, and therefore the entire area of the chip may be increased. Further, since there is a two-stage signal path, the processing speed is slower than that of the inverter circuit which includes the pair of the first MOS transistors MP11, MN11.

Further, mutually independent N-type and P-type MOS transistors and NPN-type bipolar transistors are formed on an epitaxial layer of a semiconductor substrate through a large number of process steps and therefore, the process is complicated, and the number of the masks required becomes large, with the result that productivity is reduced.

In addition, in the case where the above Bi-CMOS logic circuit is used for obtaining signal products, the formation of vertical PNP transistors becomes impossible, and its application to the actual products is limited.

SUMMARY OF THE INVENTION

The present invention is intended to overcome the disadvantages of the above Bi-CMOS logic circuit.

Therefore, it is an object of the present invention to provide an integral Bi-CMOS logic circuit in which the functional section and the driving section are combined into a single stage, thereby making it possible to decrease the area of the chip and to reduce the manufacturing cost.

It is another object of the present invention to provide an integral Bi-CMOS logic circuit in which N-type and P-type MOS transistors and NPN-type and PNP-type bipolar transistors are all used in such a manner as to form a complete Bi-CMOS logic circuit, thereby making the circuit applicable to all semiconductor products.

In achieving the above objects, the integral Bi-CMOS logic circuit according to the present invention comprises: a pair of first transistors including of a first MOS transistor receiving input signal through its gate, and a first bipolar transistor with its gate connected to the drain of the first MOS transistor outputting a first signal output; and a pair of second transistors including of a second MOS transistor receiving the input signal through its gate, and a second bipolar transistor with its base connected to the drain of the second MOS transistor outputting the first output signal, a final output signal being outputted through a common emitter terminal of the first and second bipolar transistors.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 3:
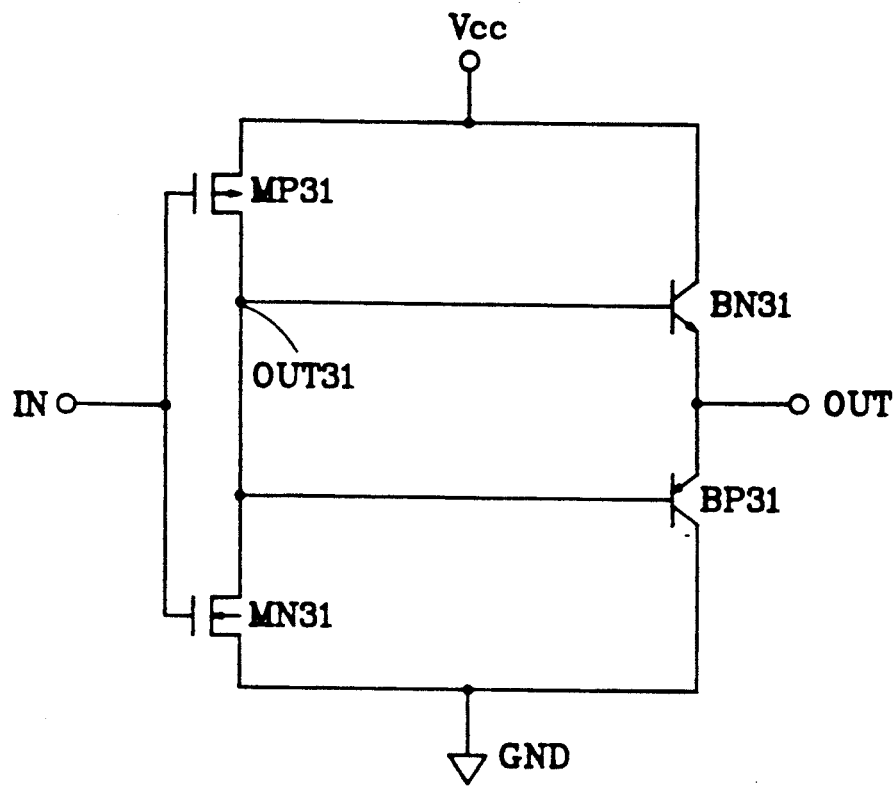
FIG. 3 is a circuit diagram of the Bi-CMOS logic circuit according to the present invention.

FIG. 3 is a circuit diagram of the Bi-CMOS logic circuit according to the present invention, which includes:

a pair of first transistors, including CMOS transistors MP31 with their gates receiving an input signal IN, with their sources connected respectively to a power source voltage Vcc and to ground GND, and with their common drain outputting a first output signal OUT31; and a pair of second transistors, including NPN-type and PNP-type bipolar transistors BN31 and BP31 with their bases receiving the first output signals OUT31, with their collectors connected respectively to the power source voltage Vcc and to ground GND, and with their commonly connected emitters outputting a final output OUT.

In this Bi-CMOS logic circuit, if, on the one hand, a low signal is inputted into its input terminal IN, the P-type MOS transistor MP31 turns on, so that the first output signal OUT31 becomes high. Consequently, a voltage Vbe between the base and the emitter of the NPN-type transistors BN31 is increased. Thus, the NPN-type transistor BN31 is turned on as soon as the voltage Vbe rises above a blocking voltage Vr, and the PNP-type transistor BP31 is turned off, so that a high signal is outputted through terminal OUT.

On the other hand, if a high signal is inputted into terminal IN, the N-type MOS transistor MN31 is turned on, so that the first output signal OUT31 becomes low. This low signal is supplied to the base of the PNP-type transistor BP31, and consequently, the base-emitter voltage Vbe is increased to turn on the PNP-type transistor BP31. Under this condition, the NPN-type bipolar transistor BN31 is turned off, so that a low signal is outputted through terminal OUT.

Under the above-described state, when the N-type MOS transistor MN31 and the PNP-type bipolar transistor BP31 are turned on, the base current of the PNP-type bipolar transistor BP31 is adjusted by the N-type MOS transistor MN31, while the inversion bias $\overline{IN}$ of the input signal IN corresponds with the base-emitter voltage Vbe of the PNP-type bipolar transistor BP31.

Further, when the P-type MOS transistor MP31 and the NPN-type bipolar transistor BN31 are turned on, the base current of the NPN-type bipolar transistor BN31 is adjusted by the P-type MOS transistor MP31 as described above, while voltage Vbe of the NPN-type bipolar transistor BN31 corresponds with the bias of the input signal IN.

Figure 4A:
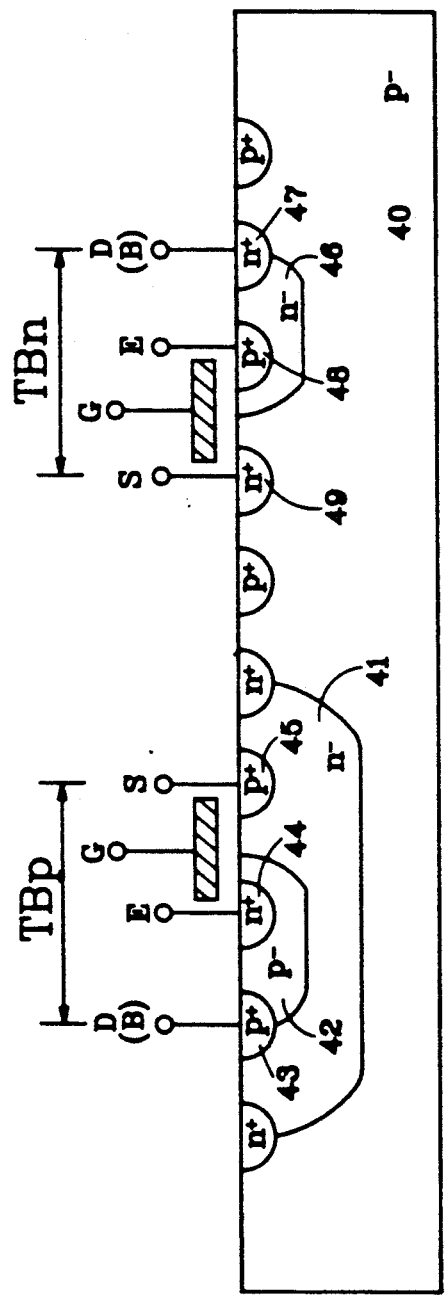
FIGS. 4A and 4B are vertical sectional views showing the Bi-CMOS logic circuit of FIG. 3 embodied on a wafer.
Figure 4B:
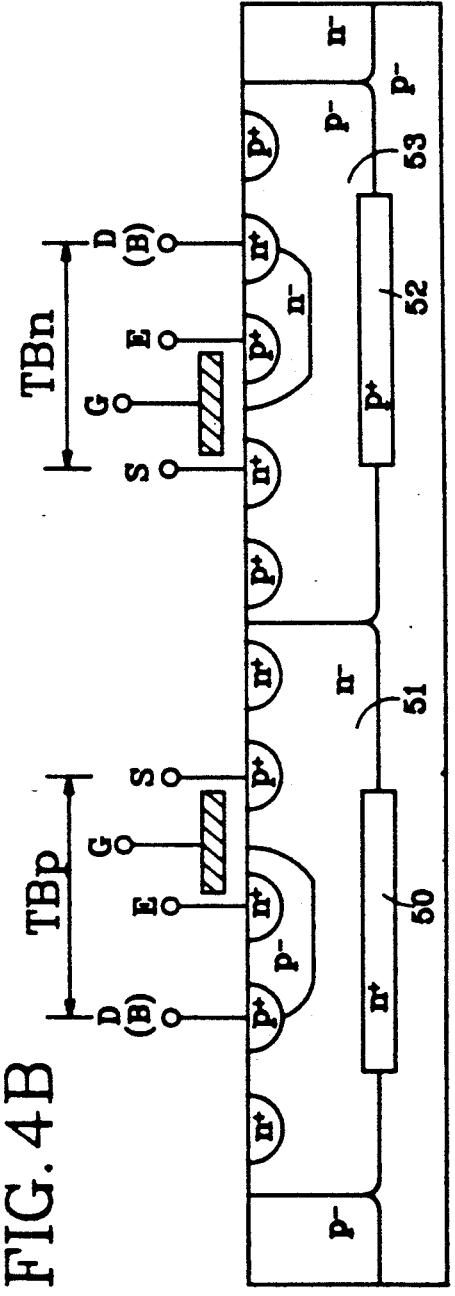

FIGS. 4A and 4B are vertical sectional views of an integrated circuit which is formed by embodying the Bi-CMOS logic circuit of the present invention (FIG. 3) on a semiconductor substrate. FIG. 4A illustrates a state in which the Bi-CMOS logic circuit is on a P-type substrate, and FIG. 4B illustrates a state in which the Bi-CMOS logic circuit is on a P-type substrate.

Figure 5:
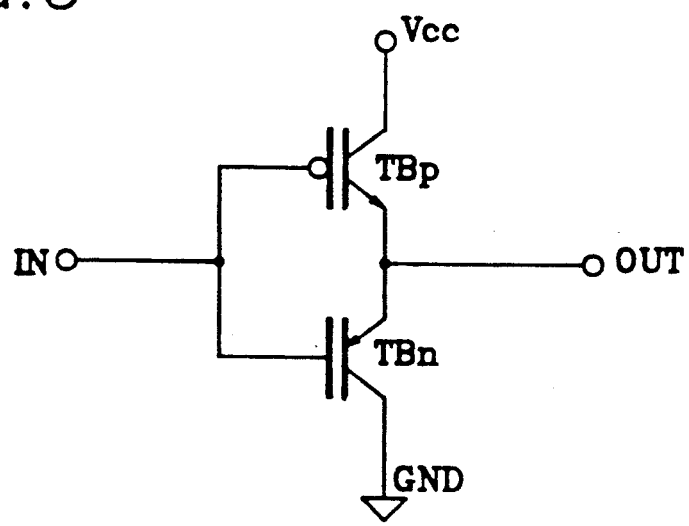
FIG. 5 illustrates new symbols for the Bi-CMOS logic circuit according to the present invention.

FIG. 5 illustrates the Bi-CMOS logic circuit of FIG. 3 by using new symbols. The P-type MOS transistor MP31 and the NPN type bipolar transistor BN31 are assigned a new symbol in the form of a transistor TBp, while the N-type MOS transistor MN31 and the PNP-type bipolar transistor BP31 are assigned a new symbol in the form of a transistor TBn.

The transistor depicted by symbol TBn is constituted such that the input IN serves as its gate, the ground GND becomes its collector, and the output OUT serves as its emitter. The transistor depicted by symbol TBp is constituted such that: the inversion input $\overline{IN}$ serves as the gate, the power source voltage Vcc serves as its collector, and the output terminal OUT serves as its emitter. Thus, in the above two transistors, the base region is controlled by the gate.

Referring back to FIG. 4A, the transistor TBp is formed in an n− well 41, and the transistor TBn is formed on a P− substrate 40. The transistor TBp is constituted such that P− and P+ drain regions 42, 43, having a dual diffusion structure of the P-type MOS transistor MP31 and a P+ source region 45, are formed within the n− well 41, and an n+ region 44 is formed within the P− region 42 to serve as the emitter region of the NPN transistor BN31.

The drain regions 42, 43 corresponding to the drains of the P type MOS transistor MP31 serve as the base region of the NPN-type bipolar transistor, while the n− well 41 serves as its collector region.

The transistor TBn is constituted such that drain regions 46, 47 having an n− and n+ dual diffusing structure and corresponding to the drains of the N-type MOS transistors MN31 are formed on a P− substrate 40; n+ source region 49 is also formed on the same substrate; and a P+ region 48 is formed within the n− region 46 in such a manner as to correspond to the emitter region of the PNP-type bipolar transistor BP31. Under this condition, the drain regions 46, 47, which correspond to the drains of the N-type MOS transistors MN31, serve as the base of the PNP-type bipolar transistor BP31, while the P-type substrate 40 corresponds to the collector region.

Referring back to FIG. 4B, this drawing shows the same structure as that of the vertical sectional view of FIG. 4A, but is different in the following respects. Instead of directly depositing the transistors on the P-type substrate 40 as in FIG. 4A, an n+ buried layer 50 and a P+ buried layer 51 are formed on the substrate 40, while n− and P− epitaxial layers 52, 53 are formed on the n+ and P+ buried layers 50, 51 respectively. That is, the transistor TBp is deposited on the n− epitaxial layer 52, and the transistor TBn is deposited on the P+ epitaxial layer 53.

The thicknesses of the base regions of the transistors TBp, TBn, i.e., the junction depths, are decided in accordance with the desired gain by using the ion implantation method. The gate is formed by using polysilicon or a silicide so that the emitter and collector regions can be aligned.

If an analogue device is to be manufactured in which the driving ability of the bipolar transistors is important, or if the Bi-CMOS logic circuit of the present invention is to be applied to a system which requires good latch-up characteristic, an integrated circuit can be preferably used, in which the Bi-CMOS logic circuit is directly embodied on an epitaxial layer as shown in FIG. 4B.

In the vertical sectional views of FIGS. 4A and 4B, it is readily seen that the Bi-CMOS logic circuit according to the present invention is an integral Bi-CMOS logic circuit which is capable of simultaneously performing the operations of the functional section and the driving section.

Figure 1:
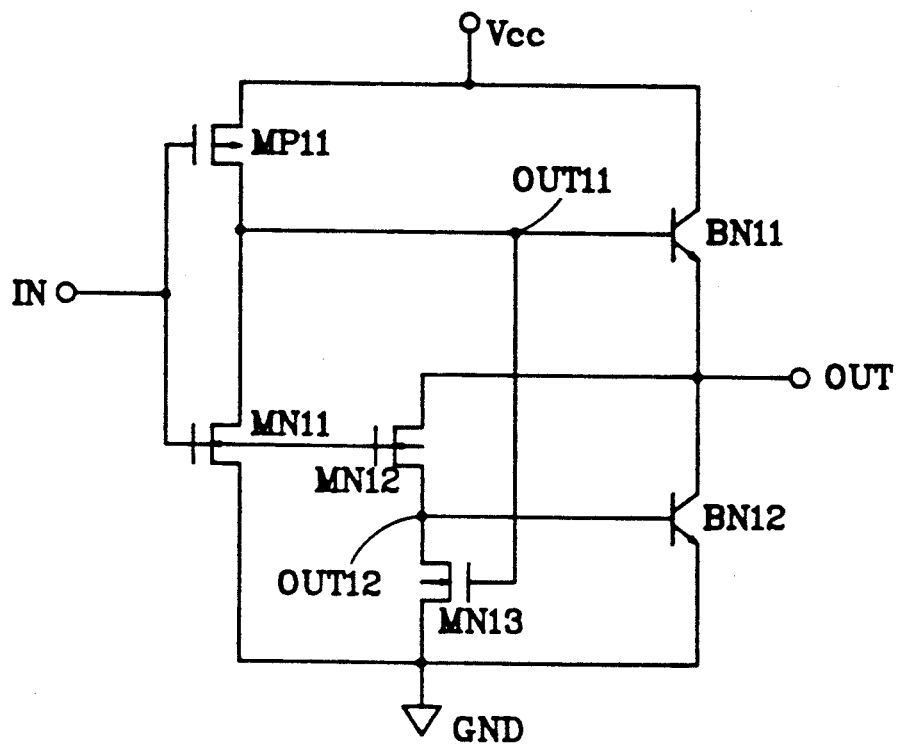
FIG. 1 is a circuit diagram of a Bi-CMOS logic circuit for background.
Figure 2:
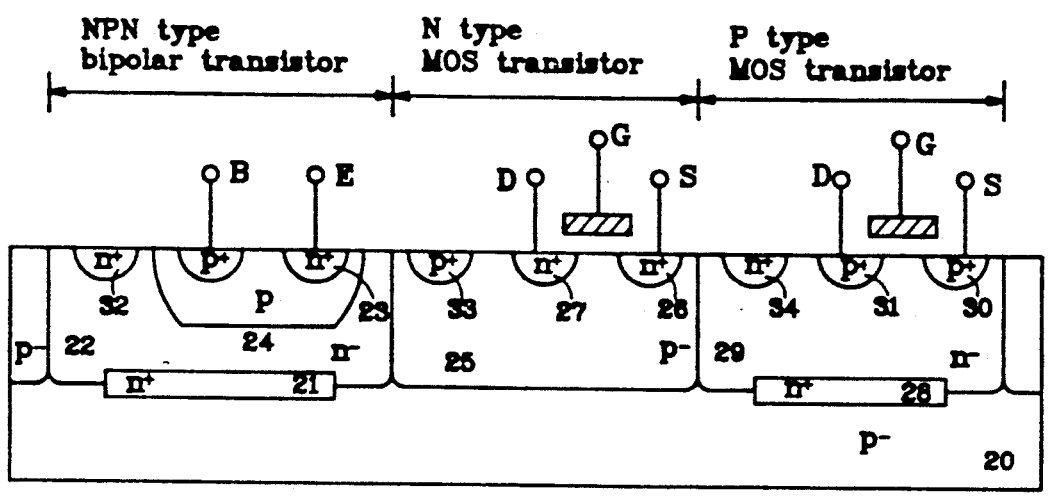
FIG. 2 is a vertical sectional view showing the Bi-CMOS logic circuit of FIG. 1 embodied on a wafer.

A comparison of the Bi-CMOS logic circuit of the present invention of FIG. 3 with the Bi-CMOS logic circuit of FIG. 1 will readily reveal the following differences.

1) The FIG. 1 Bi-CMOS logic circuit is formed by providing mutually independent N-type and P-type MOS transistors and NPN-type bipolar transistors, and thereafter simply interconnecting them, whereas the Bi-CMOS logic circuit of the present invention is formed by combining MOS transistors and bipolar transistors, thereby decreasing the area of the chip.

Further, according to the present invention, MOS transistors MN12, MN13 for the feed-back and the two NPN-type bipolar transistors BN12, BN11 are not required, and therefore, an area corresponding to these transistors can be saved.

2) The present invention achieves a complementary combination of the mobility of the electrons and positive holes by combining N-type MOS transistors with PNP-type bipolar transistors, and P-type MOS transistors with NPN-type bipolar transistors. Therefore, the matching between the rising time and the falling time can be easily carried out during the application of the circuit.

3) Comparing the circuit of FIG. 1 with that of FIG. 3 in terms of the power noise endurance of the output level of the driving transistors BN11, BN12, BN31, BP31, the Pn junctions of the GND terminal and the Vcc terminal take a reverse form in the output terminal (OUT) and, therefore, can protect the circuit of the present invention from noise to maintain a high signal-to-noise ratio.

Figure 6:
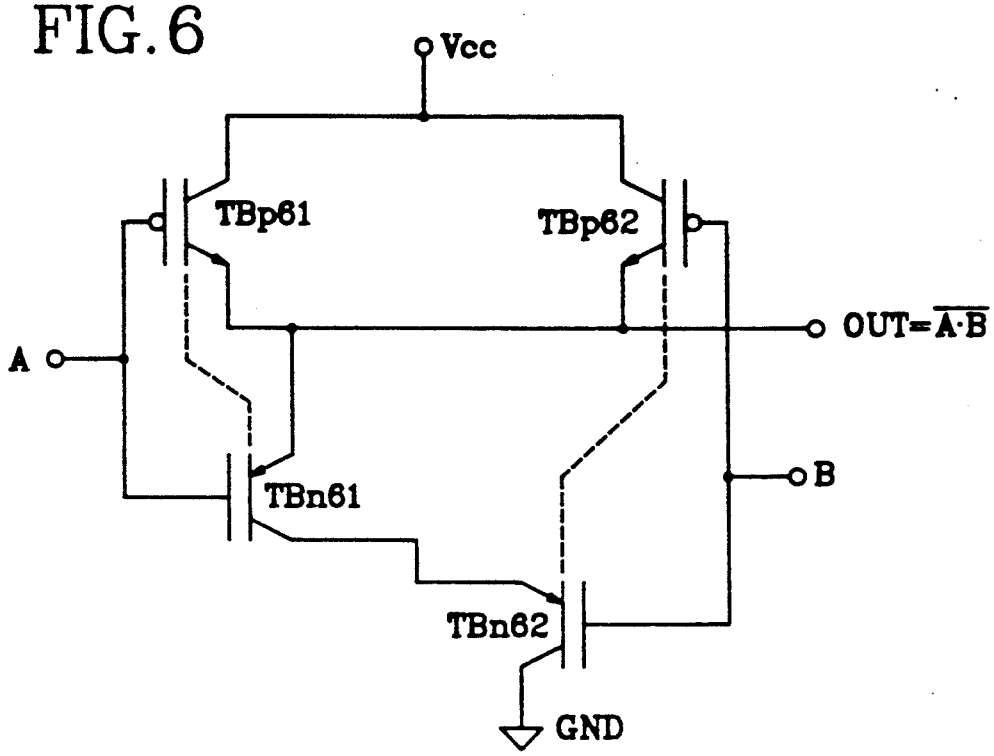
FIG. 6 is a circuit diagram of a NAND gate formed by using the Bi-CMOS logic circuit according to the present invention.

FIG. 6 illustrates a NAND gate embodied by using the Bi-CMOS logic circuit of the present invention, which is assigned with the symbols of FIG. 5. If a low signal is inputted into any one of the inputs A, B, one of transistors TBp61, TBp62 or both of them, are turned on by the inputted low state signals A, B. Under this condition, a transistor TBn61 is necessarily turned off if the transistor TBp61 is turned on. If the transistor TBp62 is turned on, a transistor TBn62 is necessarily turned on. By contrast, both of the transistors TBn61, TBp62 are necessarily turned off, if both of the transistors TBp61, TBp62 are turned on. Therefore, if a low signal is supplied to any one of the input terminals A, B the output signal becomes high.

If a high signal is supplied to both of the input terminals A, B, then both of the transistors TBp61, TBp62 are turned off, and the transistors TBn61, TBn62 are turned on, so that a low signal is outputted through terminal OUT, and thereby the logic operation of the NAND gate is satisfied.

Figure 7:
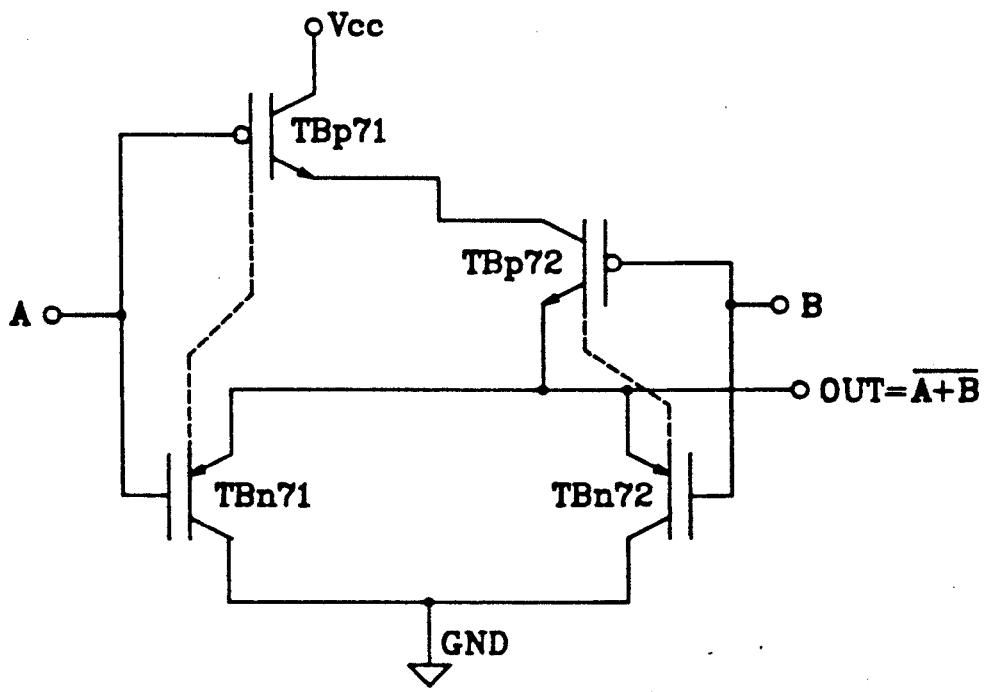
FIG. 7 is a circuit diagram of a NOR gate formed by using the Bi-CMOS logic circuit according to the present invention.

FIG. 7 illustrates a NOR gate circuit embodied by using the Bi-CMOS logic circuit of the present invention. If a low signal is supplied to both of the input terminals A, B, transistors TBp71, TBp72 are simultaneously turned on, while if any one of the inputs for the input terminals A, B has a low level, then one of the transistors TBn71, TBn72 is necessarily turned on, so that a low signal is outputted through terminal OUT, thereby satisfying the logic operation of the NOR gate.

According to the present invention as described above, through the provision of an integral Bi-CMOS logic circuit, the area of the chip can be reduced, a noise stability can be achieved, a high speed characteristics can be obtained, and the cost of carrying out the manufacturing process can be reduced.

Further, the hot electron effect which occurs during scaling down in conventional Bi-CMOS logic circuits can be prevented by forming a dual diffusing structure, thereby improving the driving capability and the reliability.

What is claimed is:

1. An integral Bi-CMOS logic circuit comprising:
   a pair of first transistors including a first MOS transistor for receiving an input signal through its gate, and a first bipolar transistor with its base connected to the drain of the first MOS transistor for outputting a first output signal; and
   a pair of second transistors including a second MOS transistor for receiving the input signal through its gate, and a second bipolar transistor with its base connected to the drain of the second MOS transistor for outputting the first output signal, the first and second bipolar transistors having a common emitter terminal for outputting a final output signal.

2. The circuit of claim 1, wherein the first MOS tranistor is a P-type, and the first bipolar transistor is an NPN-type.

3. The circuit of claim 1, wherein the second MOS transistor is an N-type, and the second bipolar transistor is a PNP-type.

4. The circuit of claim 1, wherein pair of the first transistors are formed on an n− well of a P-type substrate, and the pair of second transistors are formed directly on the P-type substrate.

5. The circuit of claim 1, wherein the pair of the first transistors are formed on an n− epitaxial layer which is in turn formed on an n+ buried layer, and the pair of the second transistors are formed on a P− epitaxial layer which is in turn formed on a P+ buried layer.

6. The circuit of claim 2, wherein the drain region of the P-type first MOS transistor is formed as a P− and P+ dual diffusion structure within an n− well, a source region of the P-type first MOS transistor is also formed within the n− well, a collector region of the NPN-type first bipolar transistor is formed as the n− well, and an n+ emitter region of the NPN-type first bipolar transistor is formed within a P− region of the NPN-type first bipolar transistor.

7. The circuit of claim 6, wherein the drain region of the P-type first MOS transistor serves as a base region of the NPN-type first bipolar transistor.

8. The circuit of claim 3, wherein the second N-type MOS transistor has a drain region comprising an n− and n+ dual diffusion structure within a P-type substrate, an n+ source region is also formed on the P-type substrate, the PNP-type second bipolar transistor has a collector region formed on the P-substrate, and an n+ emitter region formed within the n− region.

9. The circuit of claim 8, wherein the drain region of the N-type second MOS transistor serves as base region of the PNP-type second bipolar transistor.

10. The circuit of claim 1, wherein the pair of first transistors are formed in a completely complementary type with respect to the second pair of transistors.

11. The circuit of claim 4, wherein a drain region of the first MOS transistor is P-type and is formed as a P− and P+ dual diffusion structure within the n− well, a source region of the first MOS transistor is also formed within the n− well, a collector region of the first bipolar transistor is formed as the n− well, and an n+ emitter region of the first bipolar transistor is formed within a P-region of the first bipolar transistor.

12. The circuit of claim 11, wherein the drain region of the P-type first MOS transistor serves as a base region of the NPN-type first bipolar transistor.

13. The circuit of claim 4, wherein the second MOS transistor is N-type and has a drain region comprising an n− and n+ dual diffusion structure within the P-type substrate, an n+ source region is also formed on the substrate, and the second bipolar transistor is PNP-type and has a collector region formed on the P-substrate, and a p+ emitter region is formed within an n− region of the second bipolar transistor.

14. The circuit of claim 13, wherein the drain region of the N-type second MOS transistor serves as a base region of the PNP-type second bipolar transistor.

15. The circuit of claim 10, wherein the first MOS transistor is a P-type, and the first bipolar transistor is an NPN-type.

16. The circuit of claim 10, wherein the second MOS transistor is an N-type, and the second bipolar transistor is a PNP-type.

* * * * *

UNITED STATES PATENT AND TRADEMARK OFFICE
CERTIFICATE OF CORRECTION

PATENT NO. : 5,172,209

DATED : December 15, 1992

INVENTOR(S) : Deugsoo Chang

It is certified that error appears in the above-identified patent and that said Letters Patent is hereby corrected as shown below:

Column 6, line 60, after "wherein" insert -- the --.

Signed and Sealed this

First Day of February, 1994

Attest:

BRUCE LEHMAN

*Attesting Officer*    *Commissioner of Patents and Trademarks*